SUPERHETERODYNE RECEIVER

Filed Feb. 8, 1947

INVENTORS
C. J. VAN LOON
W. BEUKEMA
J. J. SCHURINK
BY & T. J. WEYERS
Fred M Vogel
AGENT Patented Jan. 2, 1951

2,536,331

UNITED STATES PATENT OFFICE 2,536,331

SUPERHETERODYNE RECEIVER

Carel Jan van Loon, Willem Beukema, Jacobus Johannes Schurink, and Theodorus Josephus Weyers, Eindhoven, Netherlands, assignors to Hartford National Bank and Trust Company, Hartford, Conn., as trustee Application February 8, 1947, Serial No. 727,370
In the Netherlands February 15, 1944

Section 1, Public Law 690, August 8, 1946
Patent expires February 15, 1964

3 Claims. (Cl. 250—20)

This invention relates to a single-knob tuning superheterodyne receiver in which the oscillator circuit comprises the usual means for securing a substantially constant difference between the tuning frequencies of the oscillator circuit and of the pre-selection circuits.

The principal object of the invention is to provide means for maintaining a substantially constant difference between the tuning frequency of the oscillator circuit and the tuning frequencies of the other tunable circuits of the receiver when tuning over a wide wave band, particularly over the mid-wave band. It has been suggested before that, for this purpose, the oscillator circuit should have added to it, in addition to the customary means, such as series and parallel condensers several supplementary circuit elements, among them inter alia ohmic resistances. Though a material tracking correction is thus secured, the required ohmic resistances lead to material damping of the oscillator circuit with the result that the efficiency of the oscillator declines.

The invention is intended to obviate this disadvantage and to provide tracking-correcting synchronism-means that do not lead to supplementary damping of the oscillator circuit.

According to the invention, the supply resistance has mounted in series with it the parallel combination of an inductance coil and a condenser which are so proportioned that the divergences of the desired constant difference between the tuning frequencies of the oscillator circuit and of the pre-circuits are cut down.

The oscillatory circuit constituted by the said inductance and condenser is preferably tuned to the oscillator frequency which is set up when the receiver is tuned to a signal frequency that is comprised in the mid-wave band and for which the said difference, in the absence of the said circuit elements, equals zero. The use of the invention has particular advantages with receivers in which use is made of a high intermediate frequency (of the order of 450 kilocycles/sec.).

Figure 1:
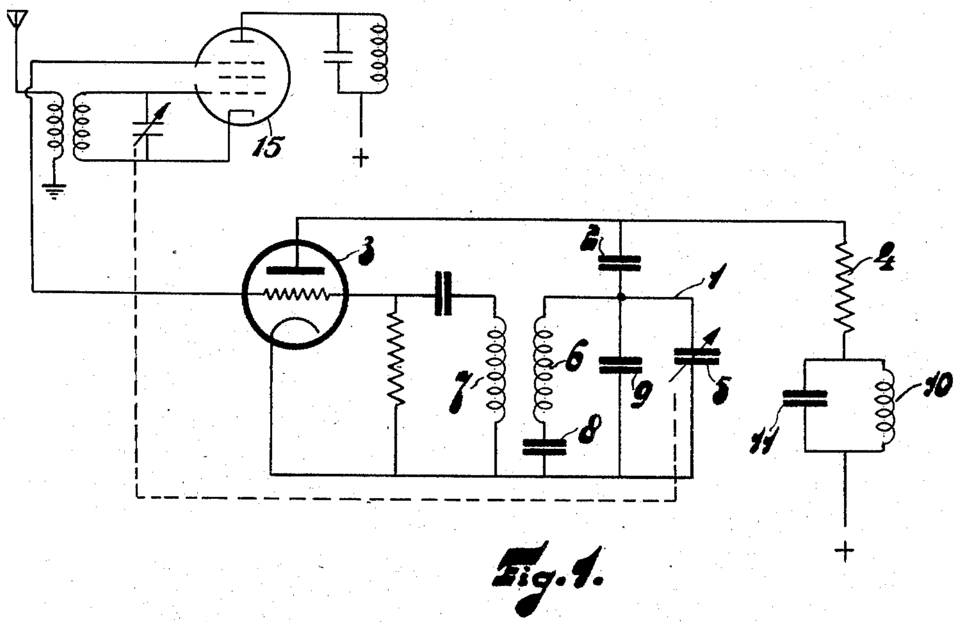
Figure 2:
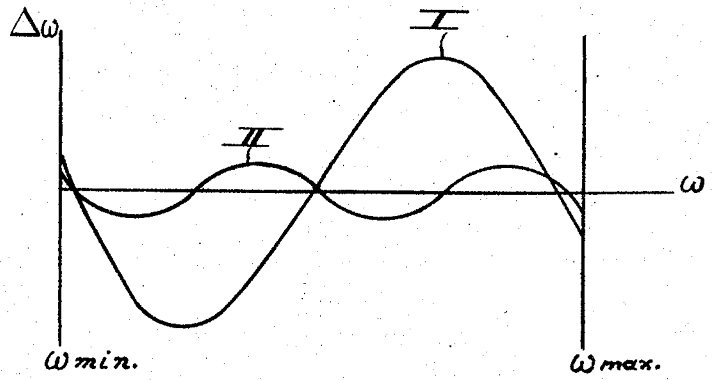

In order that the invention may be clearly understood and readily carried into effect it will be set out more fully with reference to the accompanying drawing, in which:

Fig. 1 is a schematic diagram showing a local oscillator circuit according to the invention in combination with a mixing stage, and Fig. 2 is a set of curves showing receiver tracking characteristics.

On the drawing is shown the oscillator stage and the mixing stage of a superheterodyne receiver in which an oscillator tank circuit 1 is included, in series with a blocking condenser 2, in the anode circuit of a triode oscillator system 3. The requisite unidirectional voltage is supplied to the anode of this oscillator system via a supply resistance 4. The oscillatory circuit 1 contains a tuning condenser 5 which is mechanically coupled in the usual manner to the tuning condensers of the pre-selection circuits, and also an inductance 6 which is coupled inductively to a feed back coil 7 included in the circuit of the triode. The input circuit and the mixing system, comprising a pentode 15, are of conventional design.

In order to secure a nearly constant difference between the tuning frequency of the oscillatory circuit and that of the pre-selection circuits, provision is made in the usual manner of a series condenser 8 and a parallel condenser 9.

In order to cut down the divergences between the said difference of the tuning frequencies and the tuning frequency of the intermediate frequency amplifier, the supply resistance 4 has connected in series with it, in accordance with the invention, the parallel combination of an inductance 10 and a condenser 11. A highly favourable effect is achieved if the supply resistance 4 has a value of about 15,000 ohms, with the oscillatory circuit, which is constituted by the inductance 10 and the condenser 11, tuned to the oscillator-frequency which is set up when the receiver is tuned to a signal frequency which is comprised in the mid-wave band and for which the difference between the tuning frequencies of the oscillatory circuit and of the pre-selection circuits, in the absence of the elements 10 and 11, equals zero. This signal frequency may be comprised in the centre of the mid-wave band, for example, at 1000 kilocycles/sec.

This effect of the invention is apparent from Fig. 2, in which the curve I denotes the divergences of the desired difference between the tuning frequencies in the absence of the circuit elements 10 and 11, whereas the curve II shows divergencies when circuit elements 10 and 11 are used.

The invention is particularly important with receivers having a high intermediate frequency (for example 450 kilocycles/sec.) because, in such receivers, divergences from the desired tracking frequently result in material distortions. The invention has the particular advantage that the corrected tracking is ensured without the introduction of suplementary damping.

What we claim is:

1. In a superheterodyne radio receiver having an input circuit comprising a first variable circuit element for tuning said input circuit to a first frequency within a first given range, a local oscillator comprising an electron discharge tube having cathode, control grid and output electrodes, a first impedance network interconnecting said output and cathode electrodes and including a first parallel resonant circuit having a second variable circuit element to tune said first parallel resonant circuit to a second frequency different from said first frequency and within a second given range, means simultaneously to adjust said first and second variable circuit elements to tune said input circuit and said local oscillator through said first and second given ranges respectively, a source of direct current potential, and a second impedance network interconnecting the junction of said first impedance network and said output electrode to said source of direct current potential and including a second parallel resonant circuit tuned to a frequency within said second given range and coupled in series with a resistive element.

2. In a superheterodyne radio receiver having an input circuit comprising a first variable circuit element for tuning said input circuit to a first frequency within a first given range, a local oscillator comprising an electron discharge tube having cathode, control grid and output electrodes, a capacitive element having one end thereof coupled to said output electrode, a first parallel resonant circuit having a second variable circuit element to tune said first parallel resonant circuit to a second frequency different from said first frequency and within a second given range intercoupling the other end of said capacitive element and said cathode, means simultaneously to adjust said first and second variable circuit elements to tune said input circuit and said local oscillator through said first and second given ranges respectively, a source of direct current potential, and a series circuit interconnecting the junction of said capacitive element and said output electrode to said source of direct current potential and including a second parallel resonant circuit tuned to a frequency within said second given range and a resistive element.

3. In a superheterodyne radio receiver having an input circuit comprising a first variable capacitive element for tuning said input circuit to a first frequency within a first given range, a local oscillator comprising an electron discharge tube having cathode, control grid and output electrodes, a capacitive element having one end thereof coupled to said output electrode, a first parallel resonant circuit having a second variable capacitive element to tune said first parallel resonant circuit to a second frequency different from said first frequency and within a second given range, means simultaneously to adjust said first and second variable capacitive elements to tune said input circuit and said local oscillator through said first and second given ranges respectively, a source of direct current potential, and a series circuit interconnecting the junction of said capacitive element and said output electrode to said source of direct current potential and including a second parallel resonant circuit tuned to a frequency within said second given range and a resistive element.

CAREL JAN VAN LOON.
WILLEM BEUKEMA.
JACOBUS JOHANNES SCHURINK.
THEODORUS JOSEPHUS WEYERS.

REFERENCES CITED

The following references are of record in the file of this patent:

UNITED STATES PATENTS

| Number | Name | Date |
|---|---|---|
| 1,896,825 | Macnabb | Feb. 7, 1933 |
| 2,042,636 | Schriever | June 2, 1936 |
| 2,049,777 | Mountjoy | Aug. 4, 1936 |
| 2,066,027 | Braaten | Dec. 29, 1936 |
| 2,095,035 | Posthumus et al. | Oct. 5, 1937 |
| 2,115,858 | Keall | May 3, 1938 |
| 2,225,897 | Bell | Dec. 24, 1940 |
| 2,234,184 | MacLaren | Mar. 11, 1941 |
| 2,239,756 | Riddle, Jr. | Apr. 29, 1941 |
| 2,454,845 | Sherman | Nov. 30, 1948 |